(12) United States Patent
Elam et al.

(10) Patent No.: US 12,163,221 B2
(45) Date of Patent: Dec. 10, 2024

(54) SYSTEM FOR CONTINUOUS ATOMIC LAYER DEPOSITION

(71) Applicant: UCHICAGO ARGONNE, LLC, Chicago, IL (US)

(72) Inventors: Jeffrey W. Elam, Elmhurst, IL (US); Angel Yanguas-Gil, Naperville, IL (US); Joseph A. Libera, Clarendon Hills, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 510 days.

(21) Appl. No.: 15/426,789

(22) Filed: Feb. 7, 2017

(65) Prior Publication Data

US 2017/0145565 A1   May 25, 2017

Related U.S. Application Data

(62) Division of application No. 14/339,058, filed on Jul. 23, 2014, now Pat. No. 9,598,769.
(Continued)

(51) Int. Cl.
*C23C 16/455* (2006.01)
*C23C 16/442* (2006.01)
(Continued)

(52) U.S. Cl.
CPC ...... *C23C 16/45544* (2013.01); *C23C 16/442* (2013.01); *C23C 16/45527* (2013.01); *C23C 16/45551* (2013.01); *C23C 16/545* (2013.01); *H01L 21/0228* (2013.01); *H01L 21/31138* (2013.01); *H01L 21/67069* (2013.01); *H10K 30/88* (2023.02); *H10K 71/00* (2023.02);
(Continued)

(58) Field of Classification Search
CPC ................................................ C23C 16/545
See application file for complete search history.

(56) References Cited

U.S. PATENT DOCUMENTS 5,649,409 A * 7/1997 Gujer ............... B65B 9/023
53/461
6,458,416 B1  10/2002 Derderian et al.
(Continued)

FOREIGN PATENT DOCUMENTS

WO   WO-2013/186426    12/2013
WO   WO-2014/121450    8/2014
(Continued)

OTHER PUBLICATIONS

Non-Final Office Action on U.S. Appl. No. 14/339,058, mailed Apr. 14, 2016, 11 pages.
(Continued)

*Primary Examiner* — Karla A Moore
*Assistant Examiner* — Nathan K Ford
(74) *Attorney, Agent, or Firm* — Foley & Lardner LLP

(57) ABSTRACT

A system and method for continuous atomic layer deposition. The system and method includes a housing, a moving bed which passes through the housing, a plurality of precursor gases and associated input ports and the amount of precursor gases, position of the input ports, and relative velocity of the moving bed and carrier gases enabling exhaustion of the precursor gases at available reaction sites.

9 Claims, 11 Drawing Sheets

Related U.S. Application Data

(60) Provisional application No. 61/857,798, filed on Jul. 24, 2013.

(51) Int. Cl.
  *C23C 16/54* (2006.01)
  *H01L 21/02* (2006.01)
  *H01L 21/311* (2006.01)
  *H01L 21/67* (2006.01)
  *H01L 51/00* (2006.01)
  *H01L 51/44* (2006.01)
  *H01L 51/56* (2006.01)
  *H10K 30/88* (2023.01)
  *H10K 71/00* (2023.01)
  *H10K 71/16* (2023.01)

(52) U.S. Cl.
  CPC ......... *H10K 71/164* (2023.02); *H10K 71/811* (2023.02); *Y02E 10/549* (2013.01); *Y02P 70/50* (2015.11)

(56) References Cited

U.S. PATENT DOCUMENTS

| | | | |
|---|---|---|---|
| 7,981,473 B2 | 7/2011 | Kim et al. | |
| 8,207,063 B2 | 6/2012 | Cowdery-Corvan et al. | |
| 8,304,019 B1 * | 11/2012 | Pichler | C23C 16/45502 427/248.1 |
| 8,318,248 B2 | 11/2012 | Elam et al. | |
| 8,486,193 B2 | 7/2013 | Werkhoven | |
| 8,785,316 B2 | 7/2014 | Werkhoven | |
| 8,859,040 B2 | 10/2014 | Dodge | |
| 2007/0281089 A1 | 12/2007 | Heller et al. | |
| 2010/0003781 A1 | 1/2010 | Van Duren et al. | |
| 2011/0121283 A1 | 5/2011 | Levy | |
| 2013/0140064 A1 | 6/2013 | Burberry et al. | |
| 2013/0210238 A1 | 8/2013 | Yudovsky | |
| 2014/0014965 A1 | 1/2014 | Kraus et al. | |
| 2014/0106500 A1 | 4/2014 | Van Duren et al. | |
| 2014/0127404 A1 | 5/2014 | Yudovsky et al. | |
| 2014/0130670 A1 | 5/2014 | Eisenberger et al. | |
| 2015/0167165 A1 * | 6/2015 | Lindfors | C23C 16/403 427/255.23 |
| 2016/0168703 A1 * | 6/2016 | Alasaarela | C23C 16/45563 427/255.28 |

FOREIGN PATENT DOCUMENTS

| | | |
|---|---|---|
| WO | WO-2014/127363 | 8/2014 |
| WO | WO-2014/130670 | 8/2014 |

OTHER PUBLICATIONS

Poodt et al., "Spatial atooomic layer deposition: A route towards further industrialization of atomic layer deposition," Journal of Vacuum Science and Technology A, vol. 30, No. 1, Jan./Feb. 2012, pp. 010802-1-010802-11.

* cited by examiner $$\frac{S_0 n_0 V}{S} \frac{u}{v} = \gamma \frac{u}{v}$$

|  | Web movement | |
|---|---|---|
|  | Same direction | Opposite direction |
| $\gamma \frac{u}{v} < 1$ Low vapor pressure, fast web | Self-extinguishing, this invention disclosure | No steady state solution, precursor flowing downstream |
| $\gamma \frac{u}{v} > 1$ High vapor pressure, slow web | Saturation, remaining precursor flowing downstream | |

Figure 2

SYSTEM FOR CONTINUOUS ATOMIC LAYER DEPOSITION

CROSS-REFERENCE TO RELATED APPLICATIONS

This application is a divisional of U.S. patent application Ser. No. 14/339,058 filed Jul. 23, 2014, now U.S. Pat. No. 9,598,769, which claims priority to U.S. Provisional Application No. 61/857,798 filed Jul. 24, 2013, which are incorporated by reference herein in their entirety.

STATEMENT OF GOVERNMENT INTEREST

The U.S. Government has rights in this invention pursuant to Contract No. W-31-109-ENG-38 between the U.S. Government and the University of Chicago and/or pursuant to DE-AC-02-06 CH11357 between the U.S. Government and the UChicago Argonne, LLC representing Argonne National Laboratory.

FIELD OF THE INVENTION

This invention relates in general to an improved system and method for atomic layer deposition ("ALD" hereafter). In particular, the invention relates to a new method and system for ALD deposition processing and manufacture of end product by using self-limiting reaction condition to avoid need of enclosures and purge areas for separation of two or more reacting gases. Consequently, there is no need for dosing valves since precursor flows continuously, and there is 100% material utilization as part of the subject ALD method. Further, a low vapor pressure precursor can be used with a fast moving conveyance system; and there is no need for isolation of different reaction zones nor for use of system components having strict tolerance features either chemically or mechanically.

BACKGROUND OF THE INVENTION

Among the techniques used to deposit thin films, chemical vapor deposition ("CVD" hereinafter) is a method that exposes substrates to one or more reacting gases. The non-volatile decomposition product is a solid material that accumulates on the substrate in the form of a thin film.

A variant of CVD is atomic layer deposition ("ALD" as previously noted). In this technique, surfaces are exposed to gaseous species that exhibit limited reactivity, that is, that the reaction and therefore the growth shuts itself down after all surface reacting sites are consumed. Conventional ALD is carried out by sequentially exposing surfaces to two or more different gaseous species. The growth during each exposure is self-limited, and this leads to homogeneous films.

In a more recent innovation of the ALD method, these sequential exposures mentioned above are separated not in time, but in space. In one configuration, a surface is moved across different enclosures, each of them containing a different gaseous species. In a second configuration, the surface is at rest, and a movable head containing two or more different enclosures is moved over the surface, resulting in alternate exposures to the reacting gases. Combinations of these two configurations also form part of the prior art.

All these prior art designs share a common feature: the need to physically isolate one gas from the other to avoid gas-phase reactions between the two species; and this feature would effectively kill the self-limited nature of ALD. Since there must be relative motion between the surface and the enclosure wherein the gas is dosed, it is not possible to have an airtight sealing of the gaseous species. Instead, a fraction of the species will diffuse out of the enclosure through the space between the moving substrate and the enclosure walls. Moreover, both the excess gas that does not react with the surface and the gas that escapes from the enclosure need to be removed from the system. This methodology requires the implementation of different purge strategies, including purge regions separating enclosures with two different kinds of gases to quickly remove the gas before it leads to undesired gas phase reactions or the use of high pressure gas to act as effective barriers between the different enclosures. Therefore, such prior art systems and methods require construction of complicated structures and highly demanding chemical processing conditions which make difficult and impractical the use of ALD for most commercial applications.

SUMMARY OF THE INVENTION

The method and system of the invention most preferably includes use of a fixed precursor gas being injected over a moving bed or conveyance coordinated such that the amount of precursor molecules released is less than the available reaction sites presented on a reaction surface by the moving bed/web incident to the flow. This methodology leads to the complete exhaustion of precursor gas with no need for removal ports, no precursor waste, and no purge stages being needed. The spacing of these injection ports is sufficient such that all precursor is adsorbed onto the moving bed/web surface before the next precursor injection port is encountered, and thus no purge stage is required. For multiple ALD layers, the bed/web can be made long enough to accommodate multiple precursor injection ports with sufficient spacing between them, or the bed/web can move back and forth under the fixed or even adjustable position injection ports.

Fixed, saturation ALD will lead to about 99%+ coverage (dependent on dwell time), while this invention, based on precursor exhaustion, will result in 95% coverage (with only random "holes" in the coverage). However, since operational ALD requires at least several passes, these coverage differences will be likely filled in or "washed out." Since this invention's approach is so much simpler than present "spatial ALD" solutions, the method and system will result in much cheaper equipment to be used (no gas bearings, no purge system, no pump-out zones, no complicated injector timing, etc.). In addition, there will be much less need for precision tolerances for system set-up and maintenance, increased equipment up-time, lower equipment maintenance, higher throughput, elimination of expensive wasted precursor, elimination of waste precursor separation or disposal requirements, much tighter coverage distribution and thus much higher quality product with a much more easily controlled process.

These and other advantages and features of the invention, together with the organization and manner of operation thereof, will become apparent from the following detailed description when taken in conjunction with the accompanying drawings.

BRIEF DESCRIPTION OF THE DRAWINGS

FIG. 2 Illustrates systematically two chemical operating regimens for low pressure, fast web flow and high vapor pressure, slow web flow;

DETAILED DESCRIPTION OF THE PREFERRED EMBODIMENTS

Figure 1:
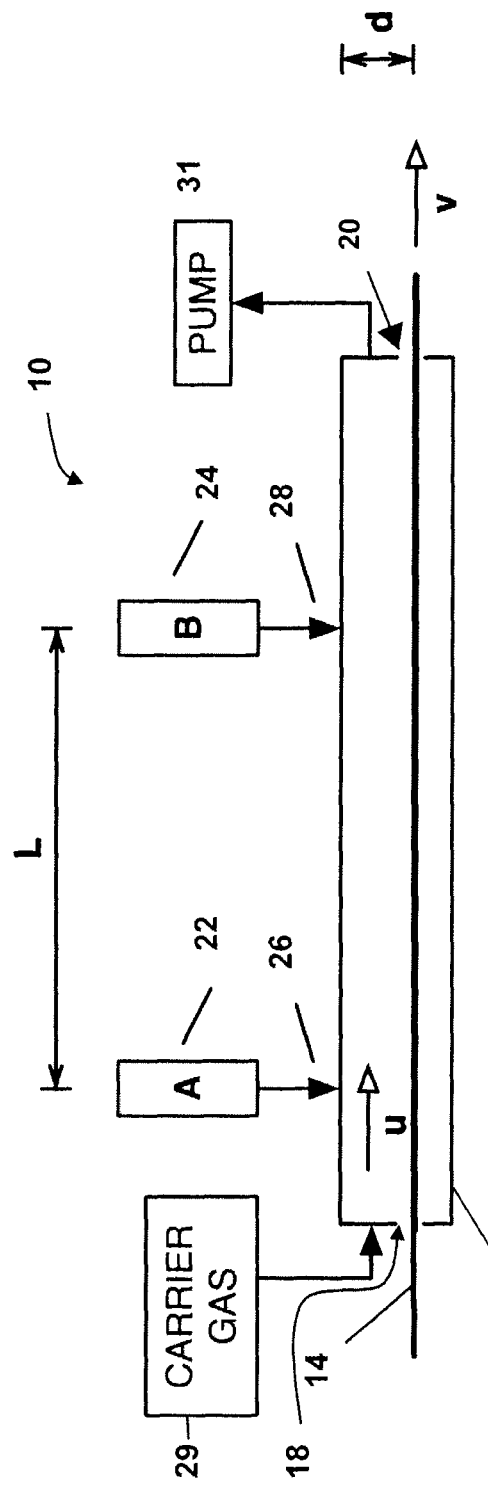
FIG. 1 illustrates one embodiment of a method and system for continuous ALD.

FIG. 1 illustrates a preferred example embodiment of one form of a continuous ALD system 10. The deposition system 10 includes an enclosure body or housing 12 that encapsulates the deposition system 10 from the exterior. This enclosure body 12 can sustain a differential pressure with respect to the outside. A moving substrate 14 enters and exits through 18 and 20. If the moving substrate 14 is a flexible web the substrate 14 can be processed outside the system 10, for instance as part of a roll-to-roll system. Two gaseous precursors, precursor A 22 and precursor B 24, are dosed into the system 10 through input 26 and input 28, respectively. The system 10 contains no means to prevent the mixing of the precursors A and B inside the system 10, including no physical separation or flow-induced separation between the inputs 26 and 28. Further, for the system 10 the insertion inputs 26 and 28 can be any design able to insert precursors inside the system 10, for instance nozzles, tubes, slits, vaporizers or any of the means known in the prior art. Various carrier gas 29 can be inserted as part of the process of the invention; and flow control can be achieved by a pump 31. It should be noted the method can be performed without need of isolation from ambient.

While the inputs 26 and 28 can include any valves and dosing mechanisms known in the prior art, including the ability to pulse the reactants, the embodiment of FIG. 1 works without having to pulse the insertion of reactants, that is, it can work under constant dose of the precursors A and/or B. The system and method avoids the presence of gas-phase reaction under self-limiting conditions by controlling the amount of the precursor dosed through system 26 and 28 in such a way that 1) the rate of consumption is faster than the rate of precursor insertion and 2) precursor A is completely consumed before reaching the input 28. This aspect of the invention can be estimated in ways that will be explained hereinafter. In the case of the design of FIG. 1, the dimensions of the system 10, the distance between the inputs 26 and 28, velocity of the substrate or the web 14 and average flow velocity are all important parameters determining the amount of precursor dosed. In addition to this, the reactivity of the precursors will also condition the amount of the precursors A and B that can be inserted in the system 10 without negatively affecting the quality of the product material.

Some advantages of this approach are:
1. 100% materials utilization: all the precursor is consumed as part of the ALD process.
2. Continuous operation: no need to pulse precursors.
3. Suitable for low vapor pressure precursors.
4. Reasonable reactor sizes, no small tolerances, robust against web vibration and other perturbations of a moving wall system.
5. Reactor size decreases with higher reaction probabilities: suitable for large surface area substrates.

A variety of operating regimes can exist for the system 10 illustrated in FIG. 1 and variations on this embodiment can function in a pure ALD mode with self-limited chemistry which can be deduced from models of precursor reactor and transport under ALD conditions. These models described hereinafter can produce good agreement under conventional ALD operations.

Considering the steady state equations of a precursor flowing into the system 10 with moving walls and where the surface chemistry is given by a first-order irreversible Langmuir kinetics, two regimes can be distinguished. These two regimes depend on an excess number, defined as the number of molecules per surface site, and the ratio of the flow and web velocity:

$$\frac{S_0 n_0 V}{S} \frac{u}{v} = \gamma \frac{u}{v}$$

Where $S_0$ is the average area of a surface site, $n_0$ is the precursor density at the entrance of the inputs 26 and 28, V and S are the volume and the surface of the system 10, u is the average flow velocity and v is the surface (or web) velocity.

These regions of reaction are shown substantially in FIG. 2. When $\gamma u/v > 1$, complete saturation is achieved; and the remaining precursor keeps flowing downstream. This region requires the isolation of the two precursors, and it is unsuitable for the one embodiment given in FIG. 1. This region correspond to the operating conditions of the prior art. However, when $\gamma u/v < 1$, 100% of the precursor is consumed. A self-extinguishing pulse under ALD conditions, has been achieved under these conditions; and a system 10 is established such as that defined in the current invention.

Note that, while in conventional CVD methods, complete consumption of the precursor is expected after a long enough distance of travel in a reactor, the existence of such region is not guaranteed under ALD conditions. Only when the precursor flows are carefully chosen to ensure the self-extinguishing condition, it is then possible to run the system 10 such as that depicted in FIG. 1 to carry out the highly desirable form of ALD described herein. Also note that two different operating conditions are possible, one in which the flow and the reactor surface of the web 15 move in the same direction and another one in which they move in opposite directions.

The characteristic length for precursor decay can be determined and which is given by:

$$L(\varepsilon) = \frac{4ud}{v_{th}\beta(1-c_0)} \log\left(\frac{1-c_0(1-\varepsilon)}{\varepsilon}\right)$$

here u is the average flow velocity, $c_0$ is the final coverage after all the precursor is consumed, $v_{th}$ is the average thermal velocity, $\beta$ is the bare reaction probability, d is the vertical gap of the reactor (distance from injector to moving web or bed), and epsilon is the tolerance for precursor depletion. This expressions is obtained under the assumption of a first order irreversible Langmuir kinetics to represent ALD's self-limited chemistry.

The separation between the inputs 26 and 28 depends on the velocity of the web 15, the vertical dimension of the reactor zone of the system 10, the mean thermal velocity, the reaction probability, the coverage and the tolerance that is required for the process. Characteristic values are shown in FIG. 3, showing how separations of the order of ten centimeters can be achieved under selected optimal conditions.

Figure 4A:
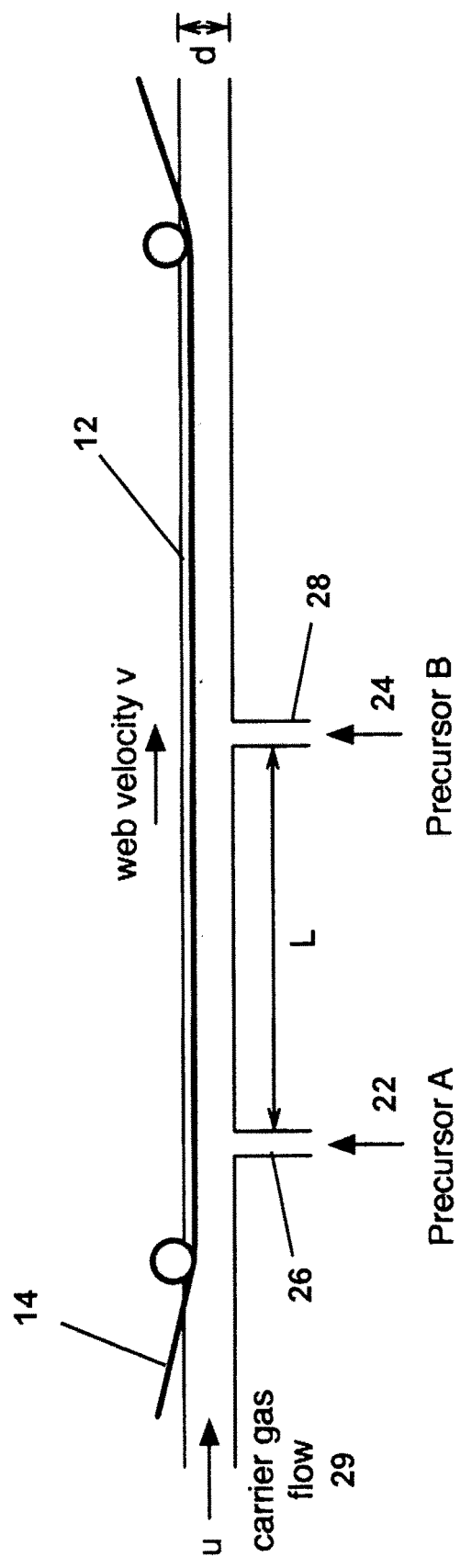
FIG. 4A illustrates a section of the reaction system with precursor A and precursor B input ports separated by distance L.

This formula above can further be used to estimate the distance between the inputs 26 and 28. Also, from the results obtained it is clear that one critical parameter in the design feature is the bare reaction probability of the precursor. Therefore, it is important to understand the chemistry of the precursor in order to adapt the experimental setup to a particular one of the system 10. Likewise, the design of the system 10 also can affect the distance between injectors. In FIG. 4A is shown the influence of width d on the characteristic length of precursor consumption under preferred ALD conditions.

Figure 3:
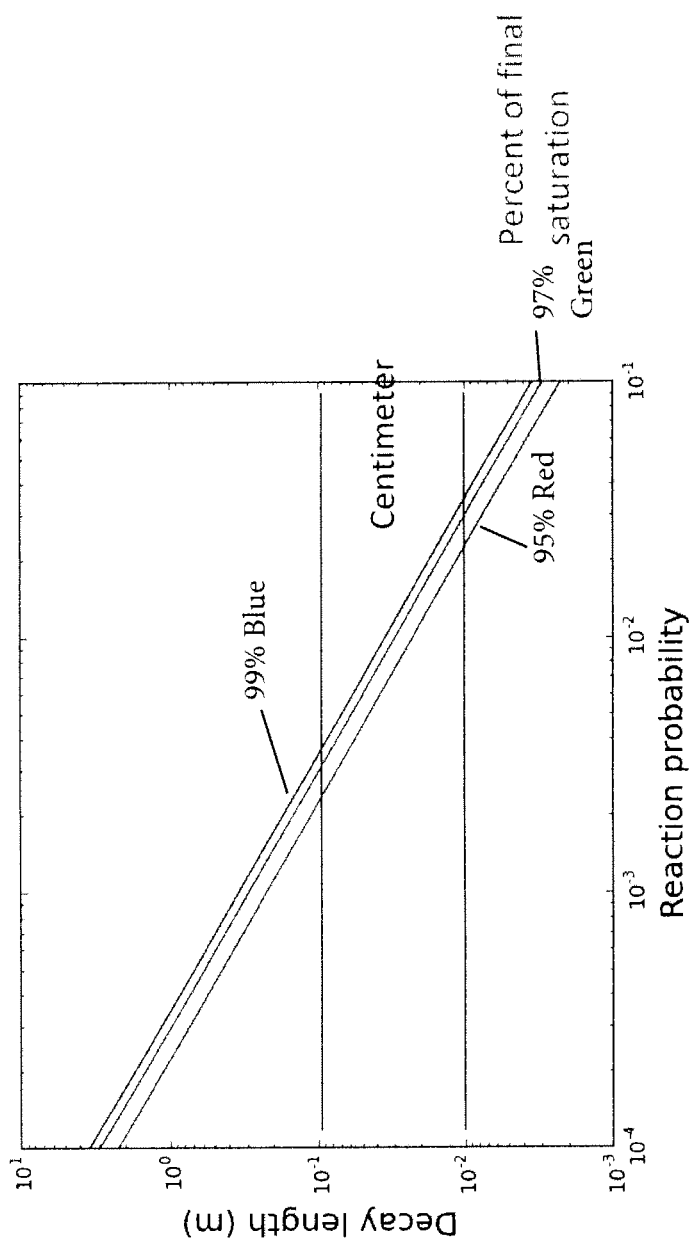
FIG. 3 illustrates characteristic decay length for a precursor versus reaction probability in the ALD reactor system.
Figure 4B:
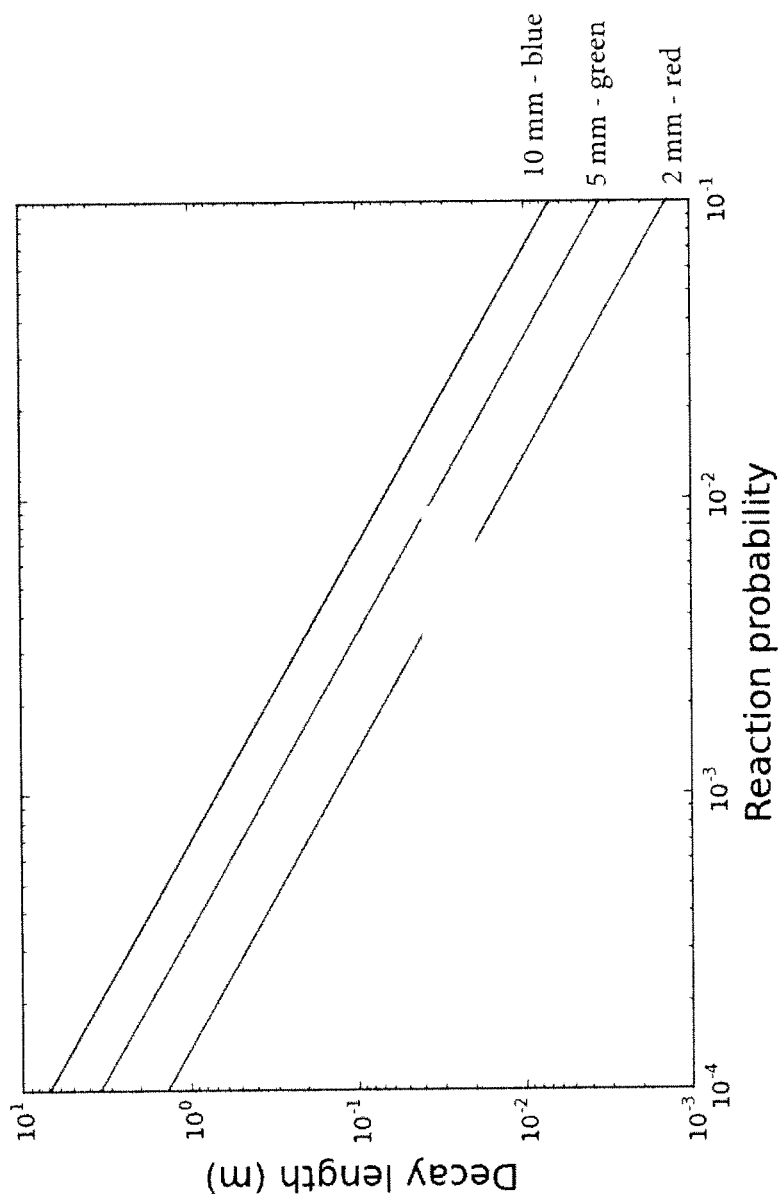
FIG. 4B illustrates characteristic decay length versus reaction probability for the system of 4A and having reaction width d.

The distances shown in FIGS. 3 and 4 have to be understood as upper boundaries with respect to a real system, since they are calculated using a one dimensional model, which is equivalent to assuming an injection slit. If the system 10 uses point inputs 26 and 28, the distance is reduced due to the influence of diffusion perpendicular to the direction of the flow.

While more complex simulations can be used to simulate the interaction between the flow and the moving walls of the web 14, the formula as presented above captures the main features of the system 10, and the ratio u/v can be chosen from more accurate, and well known, computational fluid dynamic simulations.

Figure 5:
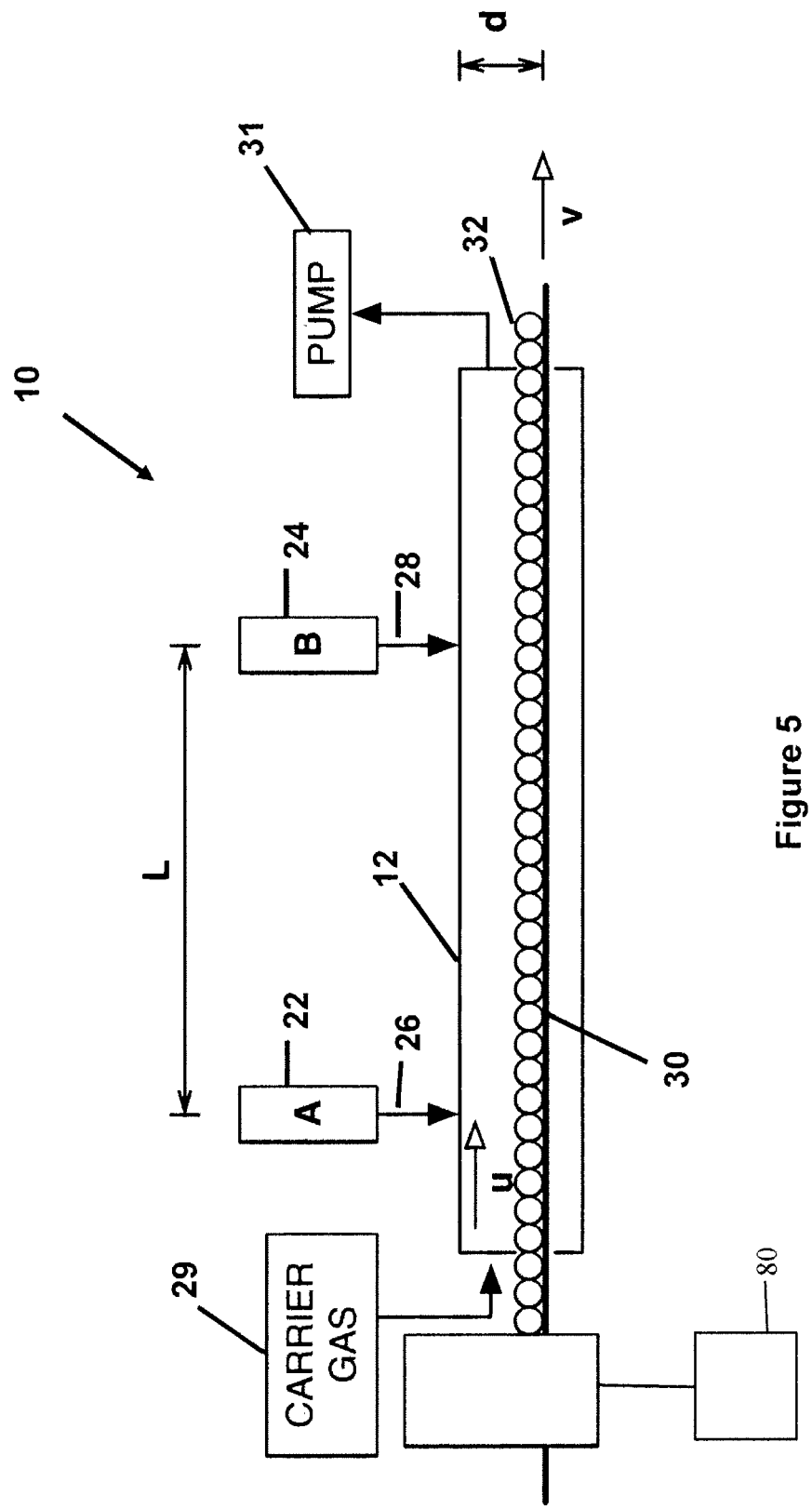
FIG. 5 illustrates adaptation of the method of the system of the invention for coating of high surface area materials, such as catalyst supports wherein particles are disposed on a moving web before being subjected to the ALD system and process.

The results show that a high reaction probability affects positively the distance between the inputs 26 and 28. This makes the method ideal to coat high surface area materials, since the effective reaction probability on high surface area materials is larger than that on planar substrates. In FIG. 5 is shown how the method and the system 10 can be adapted to the coating of high surface area materials, for instance a catalyst support 30. In FIG. 5 we have the system 10 being similar to that presented in FIG. 1, except that prior to its treatment in the ALD system 10, particles 32 are deposited onto the moving surface of the web 14. Therefore, the moving surface acts as a conveyor belt for the particles 32, allowing their treatment in a continuous operation. Examples of this method can include methods to synthesize catalyst in a continuous operation by the ALD or to modify electrode materials for energy storage applications, such as batteries.

Figure 6:
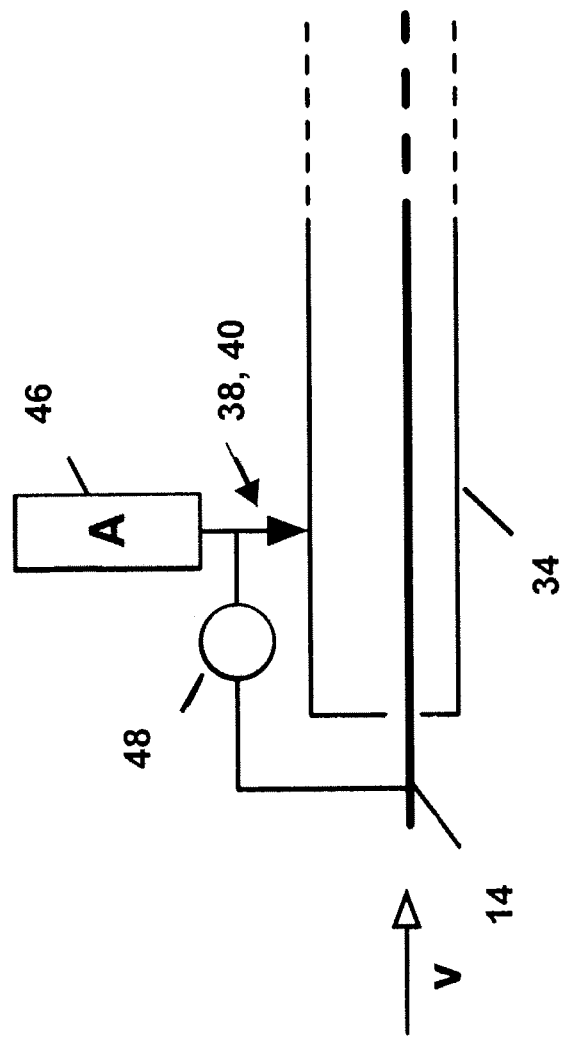
FIG. 6 illustrates another ALD system embodiment similar to FIG. 1 but with a controller and precursor feed system or reservoir.
Figure 7:
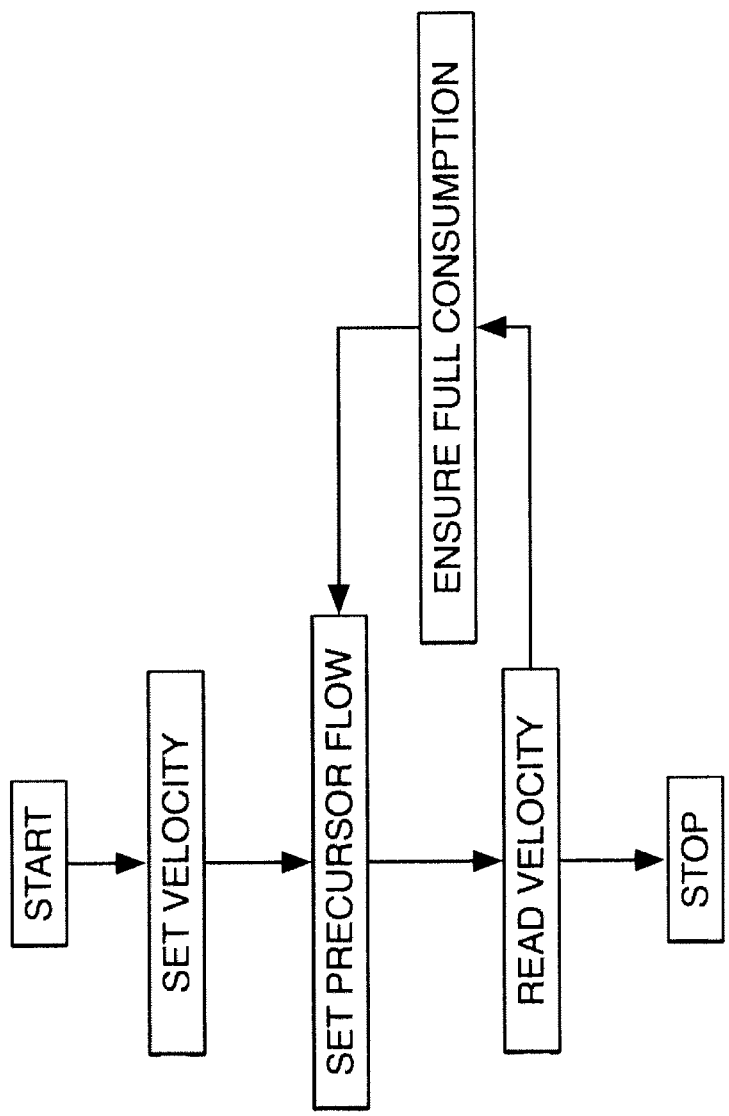
FIG. 7 illustrates a schematic flow diagram in one embodiment of operating one ALD method and system of the invention.

In another embodiment, since the results above show a correlation between the dosing and the velocity of the surface of the web 14, in FIG. 6 an embodiment is shown which is similar to that of FIG. 1, with an enclosure body or housing 34 in which a moving surface 36 is fed and coated by one or more inputs 38 and 40 connecting the housing 34 to a precursor reservoir or feed system 46. In this embodiment, there is included a flow controller 48 that establishes a feedback between the velocity of the web 14 and the amount of precursor dosed. Through use of the flow controller 48, the precursor flow is controlled as a function of the velocity of the web 14, and the velocity of the web 14 is controlled as a function of the flow. Therefore a bidirectional feedback between velocity and reactant flow is established. Through the use of the controller 48 the system 10 ensures its operation under the self-extinguishing regime as described hereinafter. One possible mode of operation of this embodiment of the system 10 is shown schematically in FIG. 7, through which the system 10 periodically measures the velocity of the web 14 and adjusts the pressure to ensure that the system 10 works under self-extinguishing conditions.

Figure 8:
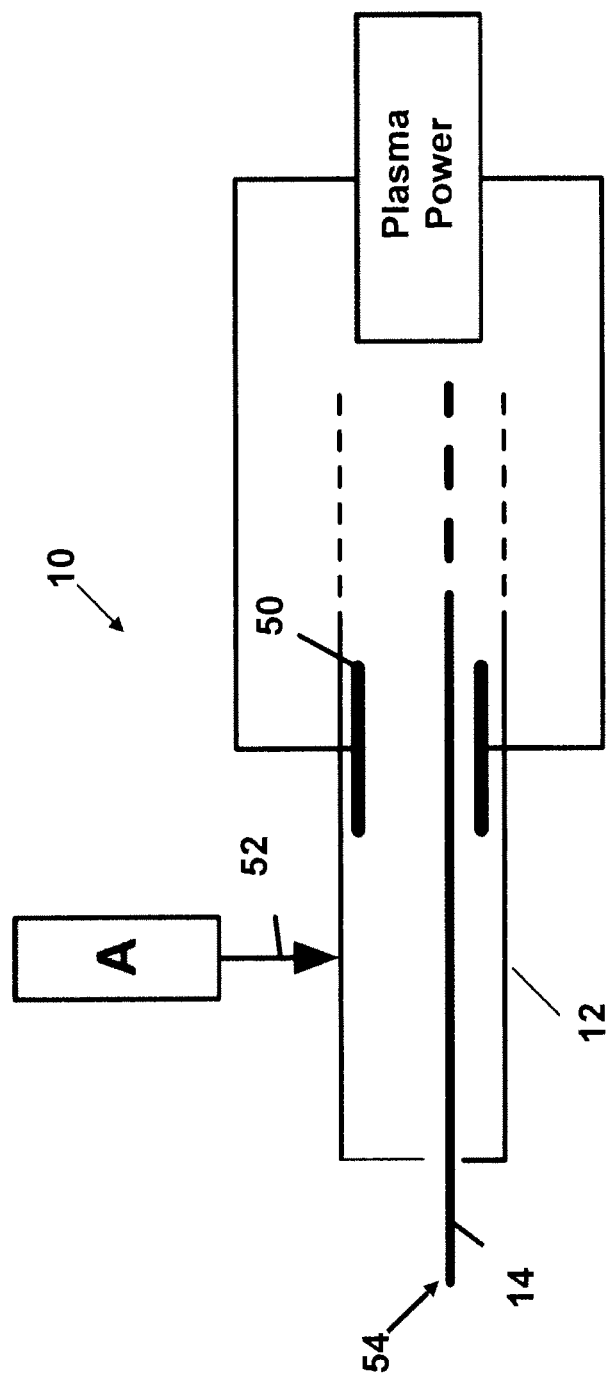
FIG. 8 illustrates another embodiment of the method and system of the invention with a plasma discharge downstream of an injector of precursor.

In yet another embodiment shown in FIG. 8, the system 10 is similar to that described in the previous figures, and includes a plasma discharge 50 generated downstream of the input 52. This plasma discharge 50 can be used to activate precursor A or otherwise incorporate a treatment process to the moving surface of the web 14 is added downstream of the precursor dose. As an example of an application of this embodiment, one could carry out a plasma etching process can be done under conditions in which the precursor is unreactive to a particular gas that is fed into the housing 12 of the system 10 but that, when activated through a plasma discharge, generates localized species that alter a deposition surface 54 inducing, for instance, the etching of organic substances.

Figure 9A:
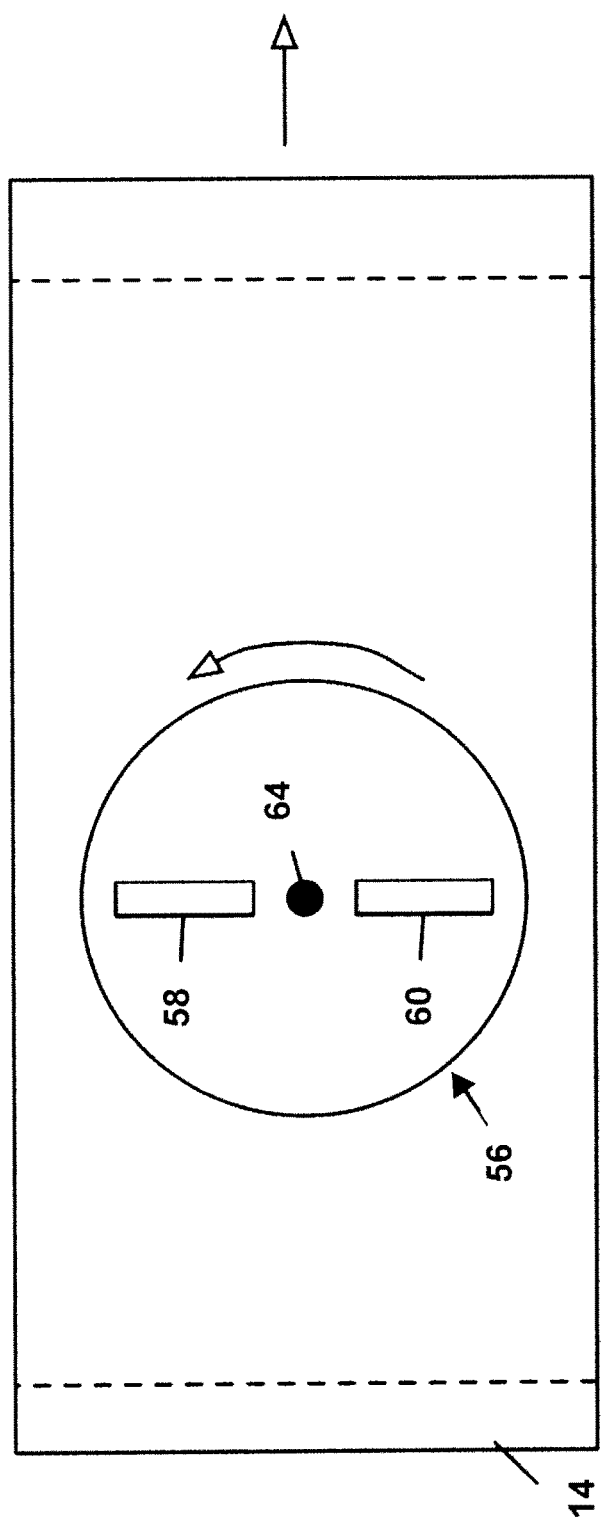
FIG. 9A illustrates a top view of yet another embodiment of the invention having a moving surface over which is a rotating head containing feed injectors disposed above the moving surface.
Figure 9B:
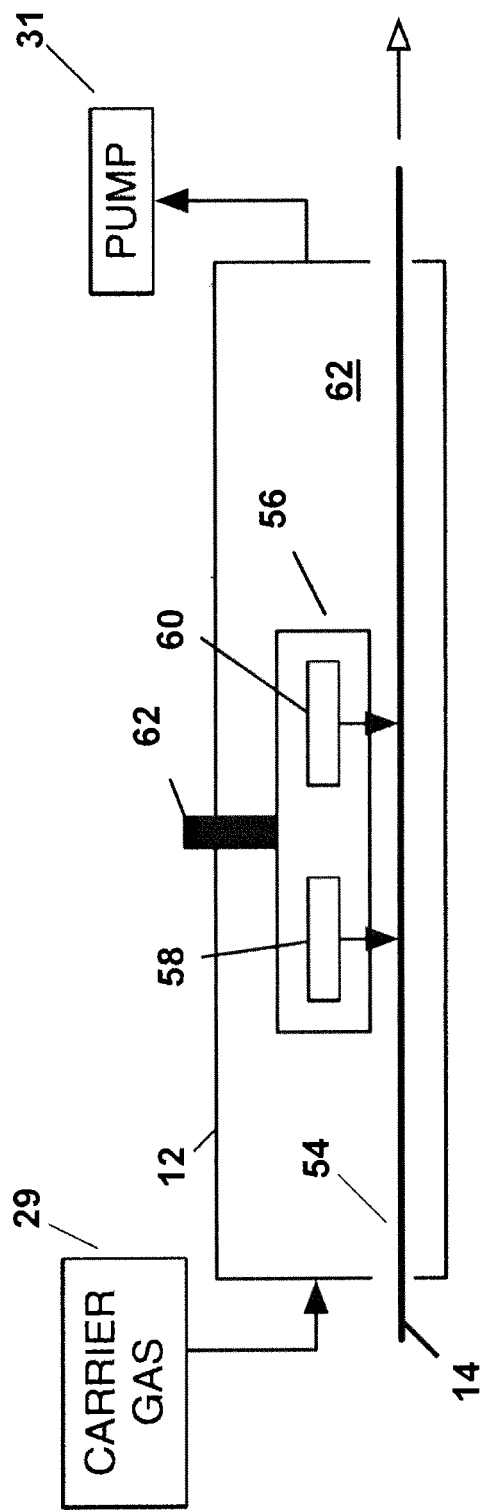
FIG. 9B is a side view of FIG. 9A.

In a further embodiment, shown in FIGS. 9A and 9B, the system 10 includes the moving surface 54 for the web 14 fed at a certain velocity. Over the moving surface 54, there is a rotating head 56. This head 56 contains inputs 58 and 60 that feed reactants into a chamber 62 directly over the moving surface 54. The inputs 58 and 60 can be single point injectors or slides. The dosing is controlled through an axle 64, either by feeding a signal that opens a reservoir inside the head 56 or by directly feeding the gases into the inputs 58 and 60. Conventional prior art mechanisms can be included in the spinning form of the head 56 to purge the gases from the system 10 and to control the gap between the surface 54 and the rotating head 56 through the use of a high flow of gas (a gas bearing). In the embodiment, the rotating head has no mechanisms for purging the excess gas or otherwise to maintain a gap or isolate the chambers based on the use of large flows. Instead the system 10 described in FIG. 9 relies on the control of the flow to achieve advantageous self-extinguishing ALD conditions described above.

In additional embodiments reasonable generalizations of the systems 10 described above, include, but are not limited to, the use of more than two channels 70 of the system 10, the variation of the spacing between the different channels 70, the use of more than one moving surfaces 54 of the web 15 and the adaptation of the reactor geometry to curved surfaces that could be used to treat surfaces directly on a roll.

The method and system adaptation described herein can be applied to any method or arrangement able to operate in an ALD mode, (thermal, plasma and radical assisted, and UV-assisted) and can be used for applications such as catalysis, photovoltaics, transparent electronics, energy storage, barrier coatings for organic photovoltaics and organic light-emitting diodes, and transparent conducting oxide materials. This method is particularly well suited for the coating of high surface area materials, for instance catalyst supports, and the coating of high-cost precursors where achieving a 100% materials utilization offers significant advantages in terms of the cost of the process.

The methodology of the invention therefore eliminates the stringent tight tolerances required in many existing spatial ALD approaches to avoid the cross-talk between different precursors in the ALD process. Instead, the method herein relies on the self-extinguishing nature of the pulse to eliminate the cross talk.

In another aspect of the methodology ALD can be used under continuous deposition of particles. The fact that the effective reaction or sticking probability becomes much larger in the presence of particles is extremely convenient for the instant invention since the speed of the continuous process relative to the size of the chamber is determined by the sticking probability.

However, the fact that the instant method does not require tight tolerances at the points where the web 15 or belt 30 crosses through the reaction embodiment means that the coating of the particles 32, as a form of the substrate in the ALD process, is enabled in the presence of mechanical agitation. This agitation greatly impacts the speed of the process by reducing the time required to achieve saturation and ensures that the particles 32 are coated homogenously. Examples of methods for increasing the mixing of the particles 32 would include including a device 80 (see FIG. 5) for vibration and/or periodic oscillations in the web 15 to fluidize the particles 32 in the gas phase inside the chamber, or they could be applied to the external operation of the moving substrate, like vibrations intrinsic from the operation of the belt 30. The mechanical agitation allows for much improved mixing of the particles 32 on the conveyor belt 30, and the ALD process is characterized by an effective sticking probability can be determined from the size, packing density and total volume of the particles 32 beforehand, and these can be used to determine the throughput of the process and tune it to the particle loading.

The present invention has been described herein with reference to the preferred embodiments and accompanying drawings. These embodiments and drawings do not serve to limit the invention, but are set forth for illustrative purposes. The scope of the invention is defined by the claims that follow. Those skilled in the art will appreciate that various modifications, additions and substitutions are possible, without departing from the scope and spirit of the invention as disclosed in the accompanying claims.

What is claimed is:

1. A system for performing atomic layer deposition comprising:
   a housing;
   a moving bed which passes through the housing, the moving bed including a reaction surface;
   a first precursor gas input opening into the housing and configured to provide a first precursor gas and a second precursor gas input opening into the housing and configured to provide a second precursor gas, the first precursor gas input and the second precursor gas input spaced apart by a precursor decay length such that all of the first precursor gas is reacted with the reaction surface prior to reaching the second precursor gas input;
   a carrier gas input configured to provide a carrier gas flow having a flow rate of u through the housing, the carrier gas input in communication with the first precursor gas input and the second precursor gas input;
   wherein the first precursor gas input is entirely positioned between the carrier gas input and the second precursor gas input and the first precursor gas input and the second precursor gas input are configured to input into the carrier gas flow, respectively, the first precursor gas and the second precursor gas, at the same time; and
   wherein the precursor decay length is given by $L(\varepsilon)$:

$$L(\varepsilon) = \frac{4ud}{v_{th}\beta(1-c_0)}\log\left(\frac{1-c_0(1-\varepsilon)}{\varepsilon}\right)$$

wherein u is an average flow velocity, $c_0$ is a final coverage after all precursor is consumed, vth is average thermal velocity, $\beta$ is bare reaction probability for the atomic layer deposition, d is a vertical gap of the first precursor gas input and the second precursor gas input from the moving bed and $\varepsilon$ is tolerance for precursor depletion, all under an assumption of a first order irreversible Langmuir kinetics; and
   wherein the system is free of physical separation and flow-induced separation between the first precursor gas input and the second precursor gas input.

2. The system as defined in claim 1, wherein the moving bed is constructed to be of a prescribed length passing through the housing to ensure complete exhaustion of the precursor gases input to the housing and the precursor gases react with the available reaction sites.

3. The system as defined in claim 1 further including a device coupled to the moving bed for mixing particles comprising the reaction surface.

4. The system as defined in claim 1 further including a control system for controlling at least one of (a) carrier gas flow rate, (b) velocity of motion of the moving bed, and (c) direction of motion of the moving bed relative to the carrier gas and/or the precursor gases.

5. The system as defined in claim 1, wherein the amounts of the precursor gas are less than available reaction sites of the reaction surface, thereby leading to exhaustion of the precursor gases input into the housing.

6. The system as defined in claim 1, wherein the system comprises gas inputs consisting of the first precursor gas input, the second precursor gas input, and the carrier gas input.

7. A system for performing atomic layer deposition comprising:
   a housing;
   a moving bed which passes through the housing of the moving bed including a reaction surface;
   gas inputs consisting of a first precursor gas input, a second precursor gas input, and a carrier gas input;
   a flow control in communication with the first precursor gas input and the second precursor gas input and configured to control the flow of first precursor gas and second precursor gas; and
   a mechanical agitation device coupled to the moving bed;
   wherein the first precursor gas input opens into the housing and is configured to provide a first precursor gas and the second precursor gas input opens into the housing and is configured to provide a second precursor gas, the first precursor gas input and the second precursor gas input spaced apart by a precursor decay length such that all of the first precursor gas is reacted with the reaction surface prior to reaching the second precursor gas input;
   wherein the carrier gas input is in communication with the first precursor gas input and the second precursor gas input;

wherein the first precursor gas input is positioned entirely between the carrier gas input and the second precursor gas input and the first precursor gas input and the second precursor gas input are configured to input into the carrier gas flow, respectively, the first precursor gas and the second precursor gas, at the same time; and wherein the precursor decay length is given by $L(\varepsilon)$:

$$L(\varepsilon) = \frac{4ud}{v_{th}\beta(1-c_0)}\log\left(\frac{1-c_0(1-\varepsilon)}{\varepsilon}\right)$$

wherein u is an average flow velocity, $c_0$ is a final coverage after all precursor is consumed, vth is average thermal velocity, $\beta$ is bare reaction probability for the atomic layer deposition, d is a vertical gap of the first precursor gas input and the second precursor gas input from the moving bed and $\varepsilon$ is tolerance for precursor depletion, all under an assumption of a first order irreversible Langmuir kinetics wherein the system is free of physical separation and flow-induced separation between the first precursor gas input and the second precursor gas input.

8. The system as defined in claim 7, wherein the moving bed is constructed to be of a prescribed length passing through the housing to ensure complete exhaustion of the precursor gases input to the housing and the precursor gases react with the available reaction sites.

9. The system as defined in claim 7, wherein the amounts of the precursor gas are less than available reaction sites of the reaction surface, thereby leading to exhaustion of the precursor gases input into the housing.

* * * * *